(12) United States Patent
Takeda et al.

(10) Patent No.: US 7,501,749 B2
(45) Date of Patent: Mar. 10, 2009

(54) VEHICLE LAMP USING EMITTING DEVICE FOR SUPPRESSING COLOR TONE DIFFERENCE ACCORDING TO ILLUMINATION CONDITIONS

(75) Inventors: Hitoshi Takeda, Shizuoka (JP); Osamu Kuboyama, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 625 days.

(21) Appl. No.: 11/262,893

(22) Filed: Nov. 1, 2005

(65) Prior Publication Data
US 2006/0091779 A1 May 4, 2006

(30) Foreign Application Priority Data
Nov. 4, 2004 (JP) ............ P.2004-320506

(51) Int. Cl.
*H01L 33/00* (2006.01)
(52) U.S. Cl. .............. 313/487; 313/488; 313/489; 313/512; 252/301.4 R; 252/301.4 H; 252/301.6 R
(58) Field of Classification Search ......... 313/498–512; 252/301.4 R, 301.4 S, 301.4 F; 315/169.3, 315/169.4
See application file for complete search history.

(56) References Cited

FOREIGN PATENT DOCUMENTS

| JP | 11-073922 | * | 3/1999 |
| JP | 2004-095480 A | | 3/2004 |
| JP | 2004-179644 | * | 6/2004 |

* cited by examiner

*Primary Examiner*—Joseph L Williams
*Assistant Examiner*—Elmito Breval
(74) *Attorney, Agent, or Firm*—Sughrue Mion, PLLC

(57) ABSTRACT

A light-emitting device (2) including a light-emitting element (2a), a first phosphor (2b), and a second phosphor (2c). The light-emitting element (2a) emits light L1 having a wavelength range within the visible region. Upon receipt of the light L1, or light L3 originating from the second phosphor (2c), the first phosphor (2b) emits light L2 having a wavelength range, which differs from that of the first light L1 and the third light L3, but falls within the visible region. Upon receipt of a specific wavelength component (ultraviolet light, or the like) included in external light, the second phosphor (2c) generates the light L3 whose wavelength range is substantially the same as that of the light L1, thereby radiating the first phosphor (2b) with the light L3.

17 Claims, 4 Drawing Sheets

VEHICLE LAMP USING EMITTING DEVICE FOR SUPPRESSING COLOR TONE DIFFERENCE ACCORDING TO ILLUMINATION CONDITIONS

This application claims foreign priority from Japanese Patent Application No. 2004-320506, filed Nov. 4, 2004, the entire disclosure of which is herein incorporated by reference.

BACKGROUND OF THE INVENTION

1. Field of the Invention

The present invention relates to a light-emitting device having a light-emitting element and a plurality of phosphors, as well as a vehicle lamp including the light-emitting device. The light-emitting device prevents a color of light during illumination from significantly differing from a color exhibited during non-illumination.

2. Description of Related Art

A vehicle lamp, which includes a light source that is a light-emitting device (such as a light-emitting diode (LED)) and a plurality of lamp units (each unit being formed of a lens, a reflection mirror, and the like), is known. A desired light distribution pattern can be obtained by combining a unit of a direct-projection type and a unit of a reflection type (see, e.g., Japanese Patent Publication 2004-95480).

However, when a white light-emitting diode is used as a light source of a lamp, it is difficult to obtain light having a wide wavelength range solely from an LED chip. Therefore, there are employed, e.g., an LED chip for emitting blue light, and a phosphor which is excited by some of blue light originating from the LED chip (hereinafter called a "blue-light-excited phosphor"). More specifically, blue light is generated from the LED chip, and a yellowish—which is a complementary color of the blue light—light is generated from the phosphor; and white light can be obtained by means of mixing the two types of light.

However, the above-described configuration involves a problem arising from a difference between a light color of the light-emitting device during illumination and a color which is exhibited externally during non-illumination.

For instance, in a state where the light-emitting element (the LED chip) is not lighting, the blue-light-excited phosphor exhibits a color tone (yellow) under external light (visible light). Therefore, in a case where the light-emitting element is used as a light source of a lamp, when reflection by way of an optical component, such as a lens or a reflection mirror, is excessive, there may arise problems, such as pseudo lighting or nonconformance with lamp specifications. For example, when a yellow component exhibited on a front face of the lamp is close to a functional color of a turn signal lamp, or the like, a problem such as false-recognition may arise depending on an extent of reflection by an optical component.

To this end, means, such as arrangement of the lamp's optical design or provision of a filter, are adopted for preventing development of a color tone during non-illumination of the lamp. However, in order to employ such means, certain problems must be solved, such as influences exerted during illumination on a light color or a light distribution pattern, or problems caused by employment of the means, such as an increase in the complexity of the configuration, or a cost increase.

The present invention aims at preventing a light color of a light-emitting device during illumination from differing from a color exhibited externally during non-illumination, thereby removing an obstacle to application of the light-emitting device as a vehicle lamp.

SUMMARY OF THE INVENTION

The present invention provides a light-emitting device which is configured so as to obtain a predetermined light source color by means of mixing a luminescent color and a fluorescent color, and which includes the following constituent elements:

(I) A light-emitting element for emitting first light whose wavelength range falls within the visible region;

(II) a first phosphor for, upon receipt of the first light or third light to be described later, emitting second light whose wavelength range differs from that of the first light or the third light but falls within the visible region; and (III) a second phosphor for, upon receipt of a specific wavelength component included in external light, generating third light whose wavelength range is substantially the same as that of the first light, thereby radiating the first phosphor with the third light.

The present invention can be used as a vehicle lamp having a light-emitting device capable of obtaining a predetermined light source color by means of mixing a luminescent color and a fluorescent color, and an optical system for obtaining illumination light through use of the light-emitting device as a light source. The light-emitting device includes the elements (I) to (III).

According to the present invention, the first light and the second light are caused to exit to the outside during illumination of the light-emitting element, and a light color is determined by composition of the two types of light. In addition, the third light and the second light are caused to exit to the outside during non-illumination of the light-emitting element, and a light color is determined by composition of the two types of light. For instance, when composite light of the first light and the second light during illumination of the light-emitting element is white light, composite light of the third light—whose wavelength range is substantially the same as that of the first light—and the second light is also white light. Therefore, composite light exiting to the outside during illumination and that exiting during non-illumination exhibit substantially the same color or similar colors.

BRIEF DESCRIPTION OF THE DRAWINGS

The advantages, nature and various additional features of the invention will appear more fully upon consideration of the exemplary embodiments of the invention, which are schematically set forth in the drawings, in which.

DESCRIPTION OF THE EXEMPLARY EMBODIMENTS

Although the invention will be described below with reference to the exemplary embodiments thereof, the following exemplary embodiments and modifications do not restrict the invention.

According to the exemplary embodiments, a light color of a light-emitting device during illumination can be prevented from differing from a color exhibited externally during non-illumination, thereby preventing confusion pertaining to functional colors of lamps, or the like. Specifically, when the light-emitting device is used in a vehicle lamp, influences due to reflection of a phosphor color (a color of a first phosphor) on a component (a lens, a reflection mirror, or the like) forming an optical system of a vehicle lamp can be prevented. This solves problems pertaining to conformance to lamp specifications.

For instance, in a case where the first light and the second light have wavelength ranges including blue, and the second light has a wavelength range including yellow, the external appearance during non-illumination can be prevented from being tinged with yellow due to reflection. That is, confusion with another lamp having a functional color other than white (umber, or the like) can be prevented.

When a UV-excited phosphor, which is excited by ultraviolet light, is employed as the second phosphor, an ultraviolet light component included in external light (natural light, or the like) can be utilized.

When the first phosphor and the second phosphor are laminated in this order on the light-emitting element, the first light and the second light are transmitted through the second phosphor. In this case, transmittance of the first light and the second light in relation to the second phosphor is preferably set to a high level. Consequently, optical absorption caused by a second phosphor layer is small.

For instance, when phosphor nano-particles, having a small particle size compared with the wavelength of the first light, are employed as the second phosphor, transmittance of the visible light is increased, thereby reducing influences, such as light extinction.

Accordingly, the exemplary embodiments of the present invention aim at preventing a color of light exiting from a light-emitting device, such as a light-emitting diode, during illumination from significantly differing from a color of light which appears during non-illumination. The light-emitting device can be used in a lamp, a traffic light, or the like.

Figure 1:
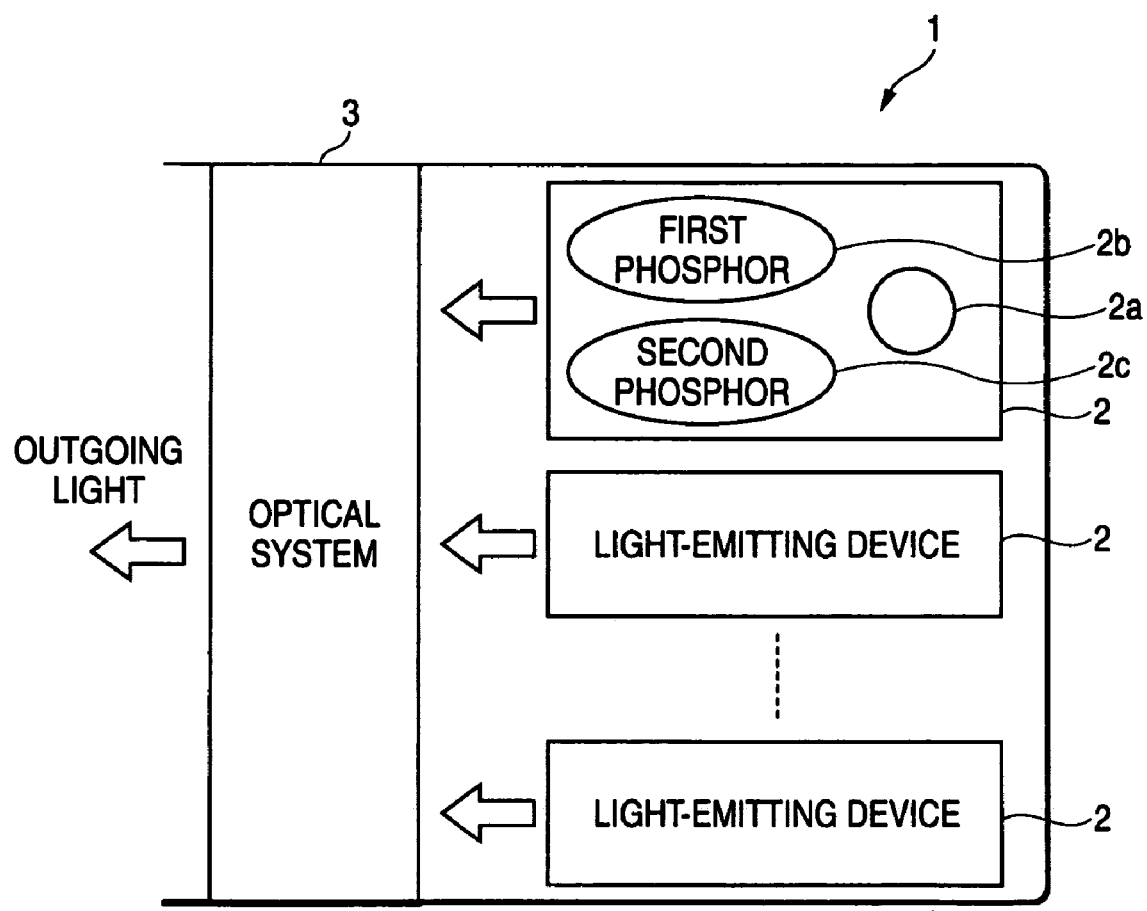
FIG. 1 is a schematic view illustrating an example configuration of a vehicle lamp according to an exemplary embodiment of the present invention.

FIG. 1 is a schematic view illustrating a configuration of a vehicle lamp according to an exemplary embodiment of the present invention.

The vehicle lamp 1 includes, in a lamp body thereof, light-emitting devices 2 and an optical system 3 for obtaining illumination light through use of the light-emitting devices 2 as light sources.

The light-emitting device 2 has a light-emitting element 2a, such as a light-emitting diode (LED); and two types of phosphors 2b and 2c. The light-emitting device 2 is configured so that a luminescent color originating from the light-emitting element 2a and a fluorescent color originating from a phosphor 2b or 2c are mixed, thereby obtaining a predetermined light color.

The optical system 3 is formed from optical components, such as a lens and a reflection mirror. In application to the exemplary embodiment of the present invention, the optical system 3 is not limited by the specific optical configuration. Example configurations include a direct-projection-type configuration, in which light originating from the light-emitting element 2a is illuminated through a projection lens, and a reflection-type configuration, in which light originating from the light-emitting element 2a is reflected by a reflection mirror and thereafter illuminated through a projection lens. Alternatively, a desired light distribution performance can be obtained by combining a plurality of sets of the two types of the light sources.

Figure 2:
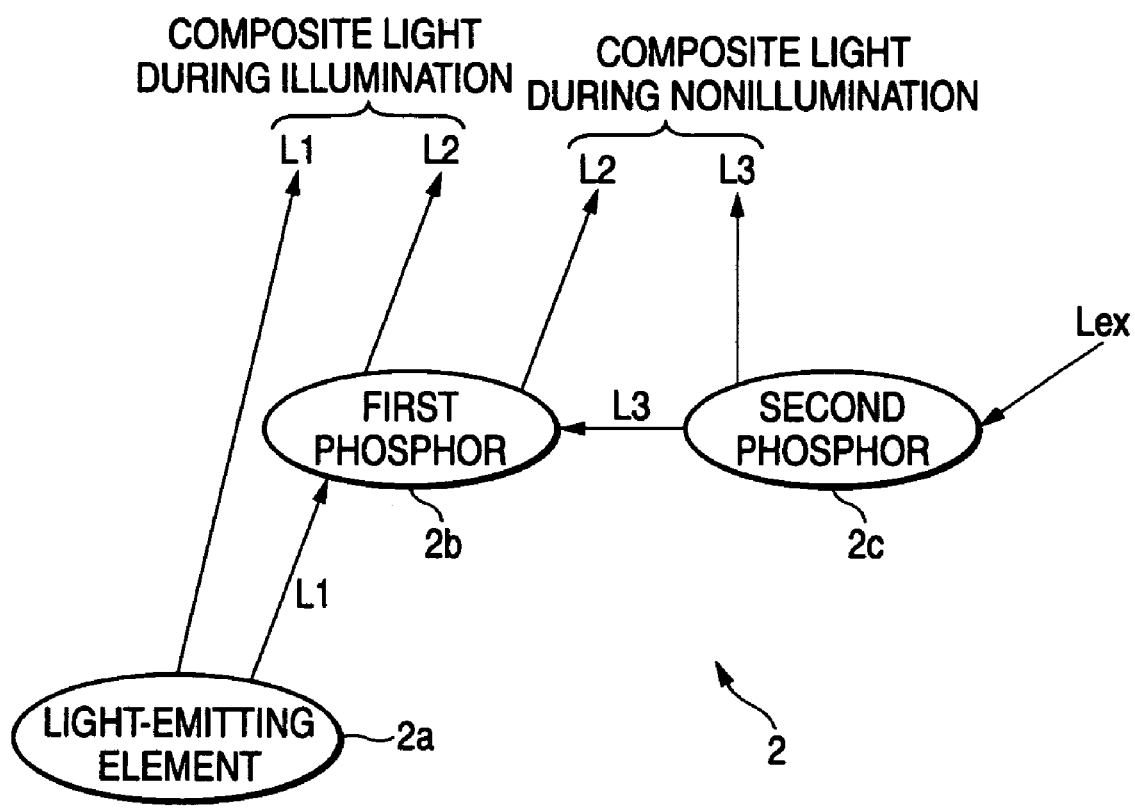
FIG. 2 is a conceptual view illustrating a basic configuration of a light-emitting device according to an exemplary embodiment of the present invention.

FIG. 2 is a conceptual view for explaining a basic configuration of the light-emitting device 2. Each of L1, L2, and L3 denotes luminescent light or fluorescent light; and Lex denotes external light.

First light L1 is light originating from the light-emitting element 2a. The first light L1 has a wavelength range falling within the visible region.

Second light L2 is fluorescence originating from the first phosphor 2b. The Second light L2 is light emitted from the first phosphor 2b upon receipt of the first light L1 or a third light L3, which will be described later. The second light L2 has a wavelength range which falls within the visible region, but differs from that of the light L1 or L3.

The third light L3 is fluorescence originating from the second phosphor 2c. The third light L3 is light emitted from the second phosphor 2c upon receipt of a specific component of the external light Lex. Upon receipt of the specific wavelength component included in the external light, the second phosphor 2c generates the third light L3, which has substantially the same wavelength range as the first light L1 or has a wavelength range including the same. When the light L3 is radiated on the first phosphor 2b, the light L2 is obtained. In a case where, e.g., an ultraviolet light component included in the external light Lex is utilized, a phosphor excited by ultraviolet light (hereinafter called a "UV-excited phosphor") is employed as the second phosphor 2c.

During illumination of the light-emitting element 2a, a composite light of the light L1 originating from the light-emitting element 2a and the light L2 originating from the first phosphor 2b is obtained. The composite light exits to the outside of the light-emitting device 2. In a case where, e.g., the light L1 has a wavelength range including blue, and the light L2 has a wavelength range including yellow, which is a complementary color of the light L1, white light is obtained as a result of color mixing of the two types of light.

During non-illumination of the light-emitting element 2a, composite light of the light L3 originating from the second phosphor 2c upon receipt of the external light Lex and the light L2 originating from the first phosphor 2b upon receipt of the light L3 is obtained. The composite light exits to the outside of the light-emitting device 2. In a case where, e.g., the light L3 has a wavelength range including blue as in the case of L1, and the light L2 has a wavelength range including yellow, white light is obtained as a result of color mixing of the two types of light.

Thus, composite light exiting to the outside from a light source section including the light-emitting device 2 exhibits substantially the same color or similar colors during illumination of the light-emitting element 2a and during non-illumination of the same.

Meanwhile, even when the light L3 is generated under influences of the external light Lex during illumination of the light-emitting element 2a, there is substantially no influence on a light color during illumination because the light L3 has substantially the same wavelength range as the light L1.

FIGS. 3 to 6 are schematic views illustrating some example configurations of a portion of the light-emitting device according to exemplary embodiments of the invention.

Figure 3:
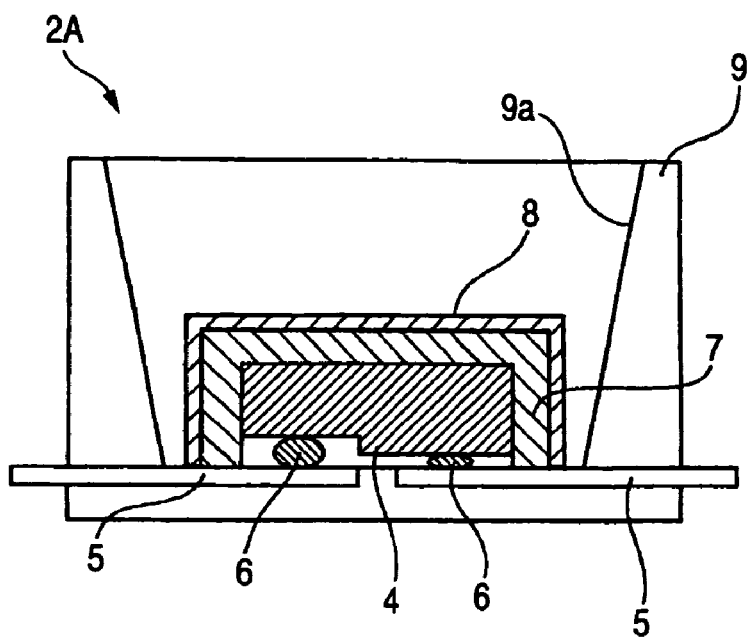
FIG. 3 is a schematic view illustrating an example configuration of the light-emitting device according to an exemplary embodiment of the present invention.

The light-emitting device 2A illustrated in FIG. 3 is an example configuration in which a blue-light-excited phosphor is employed as the first phosphor 2b, and a UV-excited phosphor is employed as the second phosphor 2c.

In this exemplary embodiment, an LED chip (corresponding to the light-emitting element 2a) is used as an optical semiconductor element 4. The LED chip is mounted on electrode sections 5, 5 on a substrate by flip chip bonding, or the like. More specifically, p-type electrodes or n-type electrodes formed on the LED chip are electrically connected to an electrode pattern on the substrate by way of solder bumps 6, 6. Meanwhile, the LED chip is formed from, e.g., a nitride compound semiconductor ($In_xGa_yAl_zN$, or the like) and a sapphire substrate. The LED chip emits blue light (having, e.g., a wavelength of 400 to 530 nm) corresponding to the light L1.

In the light-emitting device 2A, a first phosphor layer 7 is formed so as to cover the LED chip; and a second phosphor layer 8 is formed further outside thereof. Hence, the light-emitting device 2A has a multilayer structure.

The first phosphor is used in the first phosphor layer 7, and emits fluorescence upon receipt of some of light originating from the LED chip. More specifically, for obtaining light corresponding to the light L2, e.g., a YAG (yttrium-aluminum-garnet) phosphor activated with cerium (Ce), or a like phosphor, is employed. By virtue of this configuration, light (e.g., light having its peak wavelength in the vicinity of 570 nm) whose wavelength component includes yellow is obtained. Blue light originating from the LED chip during illumination of the same, and fluorescence originating from the first phosphor layer 7 upon receipt of the blue light are combined, thereby obtaining white light.

The second phosphor is used in the second phosphor layer 8. In the present embodiment, a UV-excited phosphor is used. The UV-excited phosphor is tinged with white under visible light, thereby exhibiting bluish white light. However, the UV-excited phosphor emits blue light corresponding to the light L3 upon receipt of ultraviolet light included in external light. As an example of the UV-excited phosphor, an aluminate phosphor represented by a chemical formula of $M1_xAl_y$: $M_2$ can be employed. In the formula, "x:y:z" represents a composition ratio of "M1:Al:O," where M1 represents one or more elements selected from among Li, Na, K, Rb, Cs, Fr, Be, Mg, Ca, Sr, Ba, and Ra; and M2 represents one or more elements selected from among Eu, Mn, and Tb.

Among aluminate phosphors, e.g., $(BaO)_x \cdot (MgO)_y \cdot (Al_2O_3)_z$:Eu is excellent in temperature characteristics as a material for emitting blue light upon excitation by ultraviolet light. Therefore, stable light-emitting characteristics can be obtained in a lamp where the phosphor is exposed to a high-temperature environment.

The thickness (denoted as "d") of the second phosphor layer 8 is specified in accordance with a mixture ratio to a binder. When the thickness increases, the phosphor becomes prone to sinking. To this end, the thickness of the UV-excited phosphor layer is desirably 100 μm ($d \leq 10^{-4}$ m) or smaller, at which sinking occurs less easily. In view of comparison with the thickness (denoted as D) of the first phosphor layer 7, the thickness "d" of the second phosphor layer 8 is set to D or smaller. More specifically, in consideration of transmittance where the light L1 and L2 are transmitted through the second phosphor layer 8, influence exerted on luminous energy during illumination, and the like, the thickness of the UV-excited phosphor layer is preferably specified as being equal in thickness with the blue-light-excited phosphor layer, or smaller.

A light-emitting section including the optical semiconductor element 4, the first phosphor layer 7, and the second phosphor layer 8 is located in a recess 9a of a housing member 9 which is disposed on the surroundings of the light-emitting section. The inner face of the recess 9a functions as a reflection surface.

During illumination of the light-emitting device 2A, the LED chip emits light; and fluorescence originating from the first phosphor layer 7 is obtained upon receipt of some of the emitted blue light. The two types of light are transmitted through the second phosphor layer 8, thereby causing white light to exit to the outside. In contrast, during non-illumination of the same, the second phosphor layer 8 emits blue light upon receipt of ultraviolet light included in external light; and the first phosphor layer 7 emits light upon receipt of the blue light. Hence, as a result of color mixture, the external appearance exhibits white color.

Figure 4:
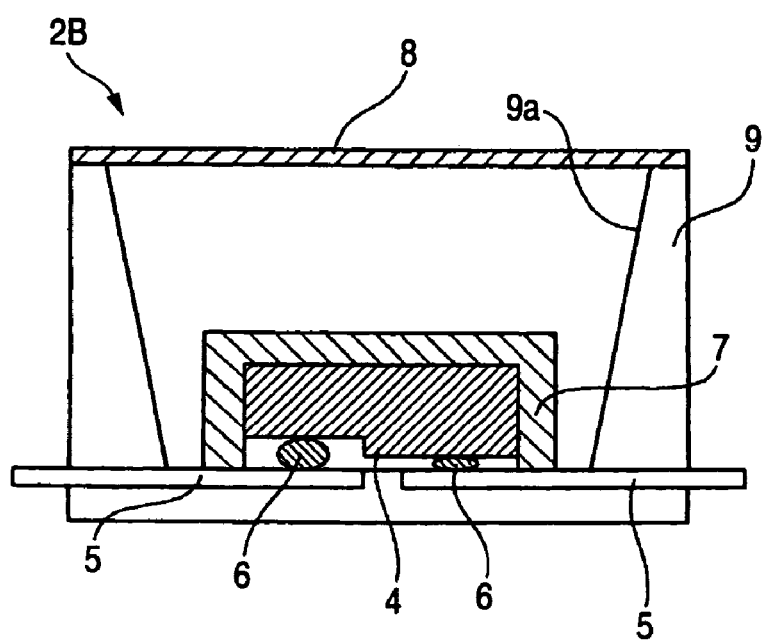
FIG. 4 is a schematic view illustrating a configuration in which a first phosphor layer and a second phosphor layer are separated, as another example of the light-emitting device according to an exemplary embodiment of the present invention.

A light-emitting device 2B illustrated in FIG. 4 differs from the light-emitting device 2A in that an opening of the housing member 9 is covered with the second phosphor (the UV-excited phosphor). Accordingly, hereinafter, descriptions will be provided mainly on dissimilarities, and elements having functions identical with those shown by reference to the light-emitting device 2A will be denoted by the same reference numerals having already been used (the same also applies to light-emitting devices 2C and 2D, which will be described later).

In this exemplary embodiment, the first phosphor layer 7 is formed so as to cover the LED chip, and these elements are located in the recess 9a of the housing member 9. In addition, the second phosphor layer 8 is formed so as to cover an opening of the recess 9a (that is, the two types of phosphor layers are in a separated state, thereby eliminating the need for lamination of the two layers, thereby providing a high degree of flexibility in terms of selection of materials, and the like).

During illumination of the light-emitting device 2B, the LED chip emits light; and fluorescence originating from the first phosphor layer 7 is obtained upon receipt of some of the thus-emitted blue light. The two types of light propagate between the first phosphor layer 7 and the second phosphor layer 8, and are further transmitted through the second phosphor layer 8, thereby causing white light to exit to the outside. In contrast, during non-illumination of the same, the second phosphor layer 8 emits blue light upon receipt of ultraviolet light included in external light; and the first phosphor layer 7 emits light upon receipt of the blue light. Hence, as a result of color mixture, the external appearance exhibits white color.

Figure 5:
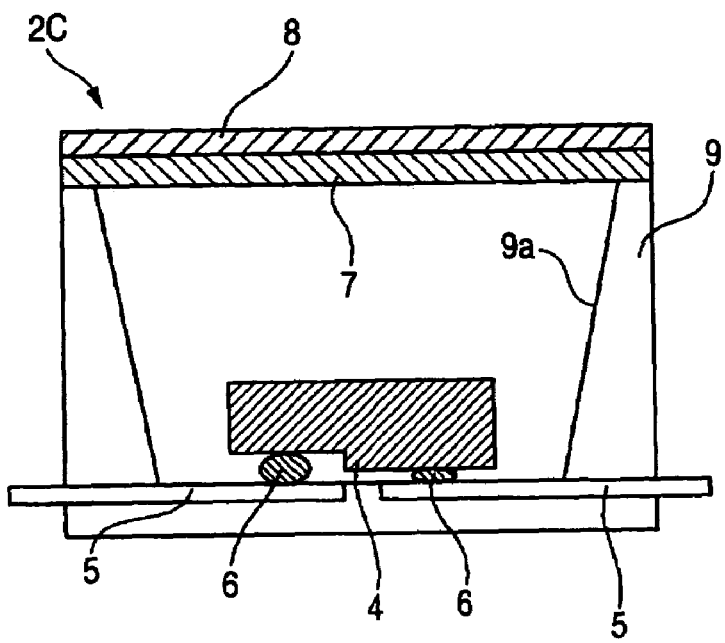
FIG. 5 is a schematic view illustrating a configuration in which a first phosphor layer and a second phosphor layer are formed at positions apart from an LED chip, as another example of the light-emitting device according to an exemplary embodiment of the present invention.

The light-emitting device 2C illustrated in FIG. 5 differs from the light-emitting device 2A in that the opening of the housing member 9 is covered with the first phosphor and the second phosphor.

In this exemplary embodiment, only the LED chip is located in the recess 9a of the housing member 9. First, the first phosphor layer 7 is formed so as to cover the opening of the recess 9a, and the second phosphor layer 8 is formed on an upper layer thereof (that is, the two types of phosphor layers are laminated).

During illumination of the light-emitting device 2C, the LED chip emits light; and fluorescence originating from the first phosphor layer 7 is obtained upon receipt of some of the thus-emitted blue light. The two types of light are transmitted through the second phosphor layer 8 which serves as the upper layer, thereby causing white light to exit to the outside.

In contrast, during non-illumination of the same, the second phosphor layer 8 emits blue light upon receipt of ultraviolet light included in external light; and the first phosphor layer 7 emits light upon receipt of the blue light. Hence, as a result of color mixture, the surface of the housing member 9 exhibits white color.

The following advantages are yielded: the need for formation of two types of phosphor layers on the outer surface of the LED chip is eliminated; the phosphor layer becomes less prone to thermal influences from a chip, degradation caused by light irradiation, and the like; a sufficient area to be occupied by a phosphor is ensured; and the layer thickness can be reduced.

Figure 6:
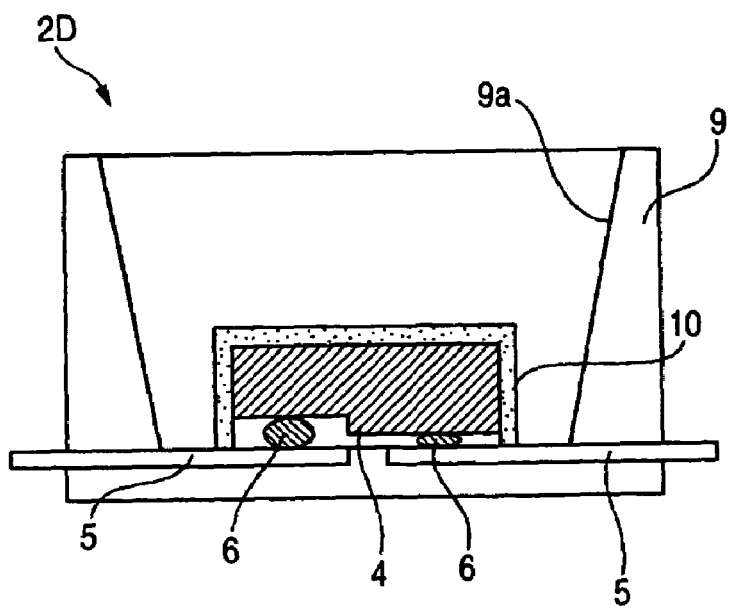
FIG. 6 is a schematic view illustrating a configuration in which a first phosphor layer and a second phosphor layer are mixed in a single layer, as another example of the light-emitting device according to an exemplary embodiment of the present invention.

The light-emitting device 2D illustrated in FIG. 6 differs from the light-emitting device 2A in that there is employed a phosphor layer formed by means of mixing the first phosphor and the second phosphor.

In this exemplary embodiment, the first phosphor and the second phosphor are not separated in layers; and the two phosphors are mixed in the same binder within a single layer. More specifically, a phosphor layer 10 is located in the recess 9a of the housing member 9 in a state where the phosphor layer 10 is formed so as to cover the LED chip.

During illumination of the light-emitting device 2D, the LED chip emits light; and fluorescence originating from a blue-light-excited phosphor included in the phosphor layer 10 is obtained upon receipt of some of the thus-emitted blue light. The blue light and the fluorescence (yellow light) are combined, thereby causing white light to exit to the outside. During non-illumination of the same, a UV-excited phosphor included in the phosphor layer 10 emits blue light upon receipt of ultraviolet light included in external light; and the blue-light-excited phosphor included in the layer emits light upon receipt of the blue light. Hence, white color is exhibited as a result of color mixture.

In the present exemplary embodiment, phosphor nano-particles are preferably employed as the second phosphor. In this case, there is yielded an effect that visible light transmitted through the phosphor layer 10 during illumination is increased. In addition, a similar effect is yielded even during non-illumination.

When phosphor nano-particles have a particle size which is small as compared with a wavelength of light (corresponding to the light L1) emitted from the LED chip, and which is, e.g., about 2 to 10 nm, the phosphor nano-particles are transparent under visible light (when the particle size is a quarter of the wavelength of visible light or smaller, sufficient transparency under visible light can be ensured). Meanwhile, the existence of light originating from fluorescence can be controlled by means of adjusting the particle size of the phosphor nano-particles, thereby enabling a change in the wavelength of the light.

In addition, as a binder, a material (a fluororesin, a dimethyl silicone resin, a silsesquioxane resin, or the like) which exhibits excellent light resistance, thermal stability, and other properties with respect to ultraviolet light is preferably employed. Meanwhile, the index of refraction can be increased by means of uniformly dispersing in the binder metal oxide particles (which are transparent under ultraviolet light) whose particle size is a half-wavelength of ultraviolet light or smaller.

As a matter of course, the invention in not limited to the present exemplary embodiments, and employment of the phosphor nano-particles as the second phosphor is also effective for the configurations illustrated in FIGS. 3 to 5. In addition, various alternative embodiments, such as mixing the second phosphor into a transparent resin member for use in sealing, or the like, are applicable.

As described above, according to exemplary embodiments of the present invention, a color (a light source color) of a light-emitting element during illumination and a color exhibited by the external appearance as a result of reflection by way of an optical component during non-illumination are the same color or similar colors in a light-emitting device. The light-emitting device is configured to be capable of obtaining a predetermined light source color by means of combining and mixing a luminescent color of a light-emitting element and a fluorescent color of a phosphor, and can be used as the light-emitting device of a vehicle lamp. Accordingly, the color during non-illumination can be prevented from being confused with a functional color of another lamp. In addition, since only disposition of the second phosphor is required to achieve the above, there is no need to worry about any increase in complexity of the configuration, or increase in cost.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

What is claimed is:

1. A light-emitting device configured to obtain a predetermined light source color by mixing a luminescent color and a fluorescent color, comprising:
   a light-emitting element for emitting first light including a wavelength range that falls within a visible region;
   a first phosphor for, upon receipt of said first light or a third light, emitting a second light including a wavelength range that differs from that of said first light and said third light but falls within a visible region; and
   a second phosphor for, upon receipt of a specific wavelength component included in external light, generating said third light including a wavelength range that is substantially the same as that of said first light, thereby radiating said first phosphor with said third light.

2. The light-emitting device defined in claim 1, wherein
   said first light and said third light have wavelength ranges including blue; and
   said second light has a wavelength range including yellow.

3. The light-emitting device defined in claim 1, wherein said second phosphor is excited by ultraviolet light.

4. The light-emitting device defined in claim 1, wherein
   said first phosphor and said second phosphor are laminated, in this order, on said light-emitting element; and
   said first light and said second light are transmitted through said second phosphor.

5. The light-emitting device defined in claim 1, wherein phosphor nano-particles, having a particle size smaller than a wavelength of said first light, are employed as said second phosphor.

6. The light-emitting device defined in claim 2, wherein said second phosphor is excited by ultraviolet light.

7. The light-emitting device defined in claim 2, wherein
   said first phosphor and said second phosphor are laminated, in this order, on said light-emitting element; and
   said first light and said second light are transmitted through said second phosphor.

8. The light-emitting device defined in claim 2, wherein phosphor nano-particles whose particle size is smaller than a wavelength of said first light are employed as said second phosphor.

9. The light-emitting device defined in claim 3, wherein
said first phosphor and said second phosphor are laminated, in this order, on said light-emitting element; and
said first light and said second light are transmitted through said second phosphor.

10. The light-emitting device defined in claim 3, wherein phosphor nano-particles, having a particle size smaller than a wavelength of said first light, are employed as said second phosphor.

11. The light-emitting device defined in claim 6, wherein
said first phosphor and said second phosphor are laminated, in this order, on said light-emitting element; and
said first light and said second light are transmitted through said second phosphor.

12. The light-emitting device defined in claim 6, wherein phosphor nano-particles, having a particle size smaller than a wavelength of said first light, are employed as said second phosphor.

13. A vehicle lamp, comprising:
a light-emitting device capable of obtaining a predetermined light source color by of mixing a luminescent color and a fluorescent color, and
an optical system for obtaining illumination light through use of said light-emitting device as a light source,
wherein said light-emitting device comprises:
a light-emitting element for emitting first light including a wavelength range that falls within a visible region;
a first phosphor for, upon receipt of said first light or a third light, emitting second light including a wavelength range that differs from that of said first light and third light but falls within a visible region; and
a second phosphor for, upon receipt of a specific wavelength component included in external light, generating said third light including a wavelength range that is substantially the same as that of said first light, thereby radiating said first phosphor with said third light.

14. The vehicle lamp defined in claim 13, wherein
said first light and said third light have wavelength ranges including blue; and
said second light has a wavelength range including yellow.

15. The vehicle lamp defined in claim 13, wherein said second phosphor is excited by ultraviolet light.

16. The vehicle lamp defined in claim 13, wherein
said first phosphor and said second phosphor are laminated, in this order, on said light-emitting element; and
said first light and said second light are transmitted through said second phosphor.

17. The vehicle lamp defined in claim 13, wherein phosphor nano-particles, having a particle size smaller than a wavelength of said first light, are employed as said second phosphor.

* * * * *